Nov. 22, 1960 D. J. SOMMERS 2,961,620

PHASE SHIFTER FOR HIGH FREQUENCY TRANSMISSION LINE

Filed Oct. 6, 1955 3 Sheets-Sheet 1

Donald J. Sommers
*INVENTOR.*

PHASE SHIFTER FOR HIGH FREQUENCY TRANSMISSION LINE

Filed Oct. 6, 1955 3 Sheets-Sheet 2

Donald J. Sommers
INVENTOR.

Donald J. Sommers
*INVENTOR.*

2,961,620

PHASE SHIFTER FOR HIGH FREQUENCY TRANSMISSION LINE

Donald J. Sommers, Brookline, N.H., assignor, by mesne assignments, to Sanders Associates, Inc., Nashua, N.H., a corporation of Delaware Filed Oct. 6, 1955, Ser. No. 538,870

3 Claims. (Cl. 333—31)

The present invention relates to high frequency transmission lines. More particularly, the invention relates to phase shifting devices for microwave printed circuit transmission lines.

Phase shifting devices may be used by varying the phase of energy propagated along a path relative to that of energy along another path. Such devices used with coaxial and wave guide transmission lines were heavy, complex and expensive. Calibration was difficult and required precise control. These devices, generally, were not compatible with devices made by modern printed circuit techniques.

It is therefore an object of the present invention to provide an improved, light weight, simple and relatively inexpensive phase shifter for high frequency transmission lines compatible with modern printed circuit techniques.

A still further object of the invention is to provide an improved phase shifter at an intermediate point in a transmission line for varying the effective electrical length of a high frequency transmission line without changing its dimensions.

A still further object of the invention is to provide an improved phase shifter for use at an intermediate point in high frequency transmission lines for varying the impedance of a line along its length.

Another object of the invention is to provide an improved phase shifter for high frequency transmission lines utilizing planar conductors.

In accordance with the invention there is provided a phase shifter for high frequency transmission lines. The shifter comprises a first planar conductor and a second planar conductor disposed in parallel with the first conductor to provide a transmission line. The conductors are in insulated spaced relation and separated less than a half-wave length apart at the highest operating frequency of the line. A part of at least one of the conductors is formed in an arc. A movable planar conductor is electrically coupled to the conductor arc. Means are provided for varying the relative position of the movable conductor along the arc effectively to vary the phase of propagated energy along the line.

In accordance with the invention there is also provided a switch for high frequency transmission lines comprising a first outer planar conductor providing a first ground plane and a second outer planar conductor providing a second ground plane. A plurality of co-planar, inner, planar conductors are disposed in parallel with and in insulated spaced relation between said outer conductors to provide a transmission line. The outer conductors are separated less than one-half of one wave length apart at the highest operating frequency of the line. A switching conductor overlaps a pair of the inner conductors and is adapted to rotate to couple selected pairs of the inner conductors together. Means are provided supporting the switching conductor between the outer conductors.

For a better understanding of the present invention, together with other and further objects thereof, reference is made to the following description taken in connection with the accompanying drawings and its scope will be pointed out in the appended claims.

Figure 1:
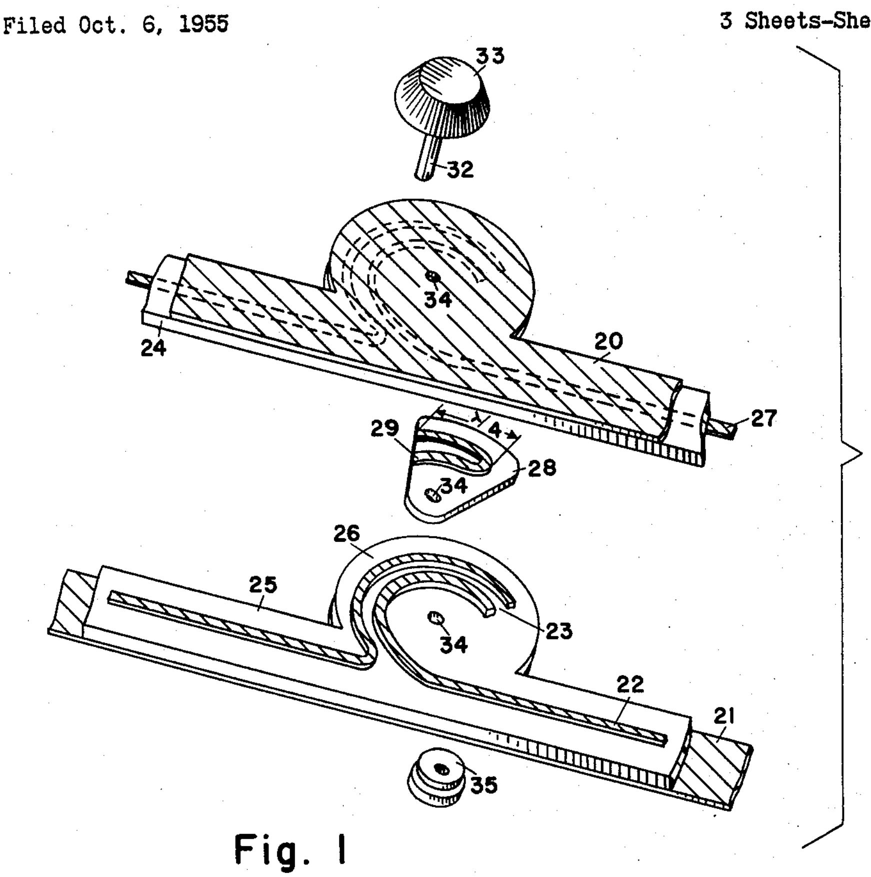
Fig. 1 is an exploded view of a phase shifter embodying the present invention.

In the drawings conductive metallic surfaces are shown cross-hatched for greater clarity.

*Detailed description*

Figure 2:
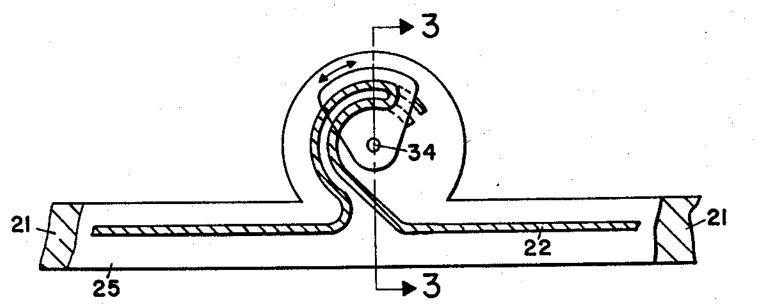
Fig. 2 is a plan view of a part of the embodiment in Fig. 1.
Figure 3:
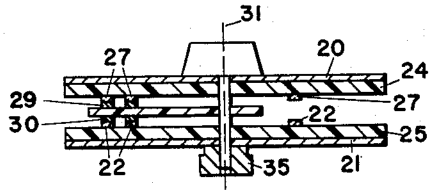
Fig. 3 is a cross-sectional view of the embodiment in Fig. 1 taken along the lines 3—3 in Fig. 2.

Referring now to the drawings and with particular reference to Figs. 1, 2 and 3, a phase shifter for high frequency transmission lines will now be described in greater detail. The transmission line comprises a first planar conductor 20 and a second planar conductor 21 which is disposed in parallel with the first conductor 20. As shown in Figs. 1 through 3 elongated, planar, inner conductors 22 and 27 are disposed between and in parallel with conductors 20 and 21. Either pair of conductors 20, 27 or 21, 22 can be considered as first and second planar conductors disposed parallel to each other to form a transmission line. Of course, such a line would be unbalanced and thus, preferably the pairs of conductors are combined into one balanced line with the conductors 22 and 27 in conductive contact to form a single conductor intermediate the external conductors 20 and 21. In such a line the conductors 22 and 27 are interrupted by a discontinuity 23 as shown and the conductors 20 and 21 are separated less than one-half of one wave length apart at the highest operating frequency of the line as shown. The conductors 20, 21, 22 and 27 are held in insulated spaced relation by dielectric insulators 24 and 25 formed, for example, of Teflon Fiberglas as manufactured by Continental Fibre Company. Parts of the inner conductors 22 and 27 are formed in a circular arc as shown at 26 with the discontinuity 23 in series with the inner conductor arc as shown. Movable, elongated, planar conductors 29 and 30 are formed in a curve having the same radii as the conductor 22 and are supported between the outer conductors 20 and 21 by a planar dielectric insulator 28. The conductors 29 and 30 may be coupled to the conductors 27 and 22, respectively, either by direct contact or through a capacitive connection. Where a capacitive connection is desired, the conductors 29 and 30 may be covered with a thin layer of a suitable insulating lacquer to reduce noise generations. The insulator 28 is rotatable about an axis 31 as defined by a shaft 32 of a tuning knob 33 in the orifices 34 as shown. A bearing 35 is attached to the shaft 32 to hold the assembly together as shown, particularly, in Fig. 3.

Figures 4, 5:
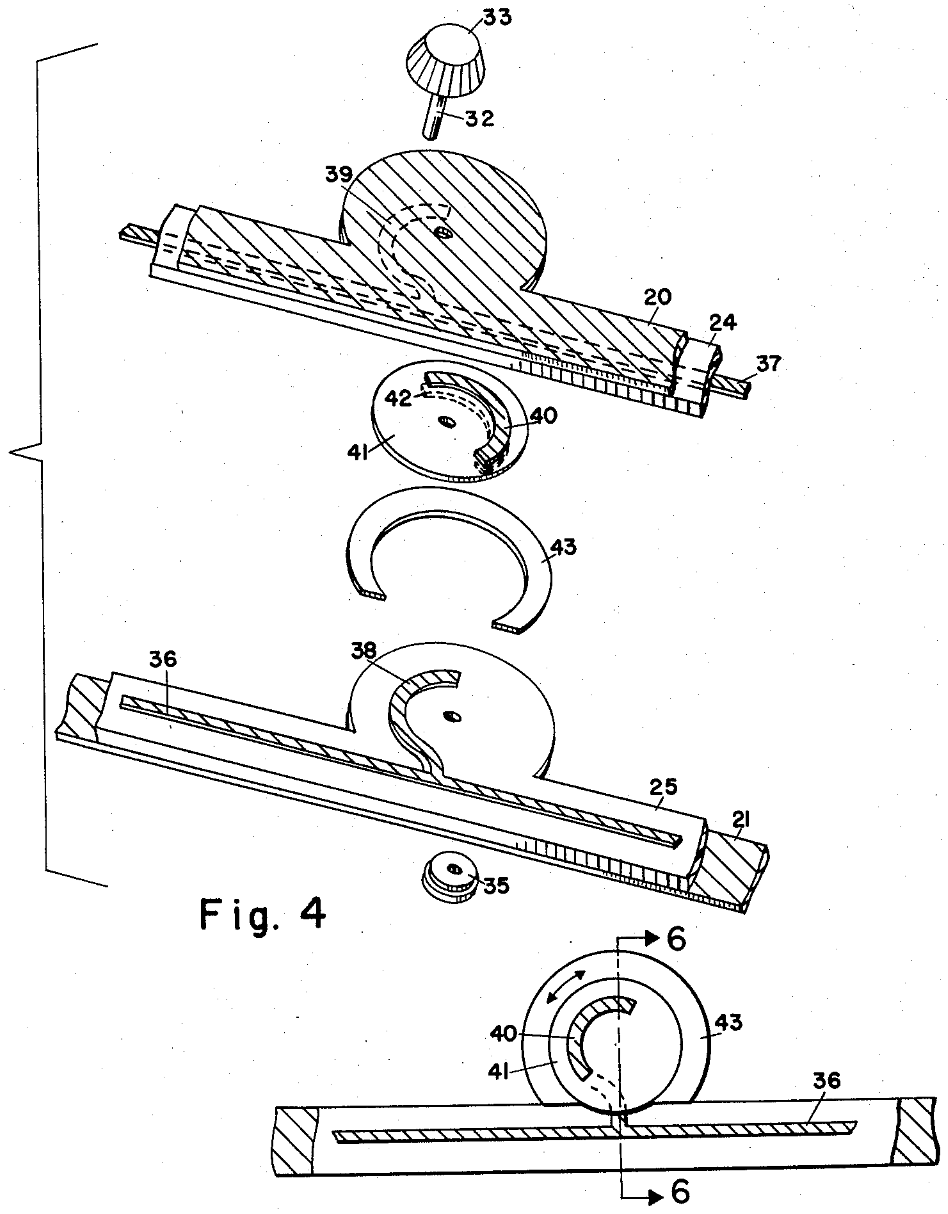
Fig. 4 is an exploded view of a modification of the embodiment in Fig. 1.
Fig. 5 is a plan view of a part of the embodiment in Fig. 4.
Figure 6:
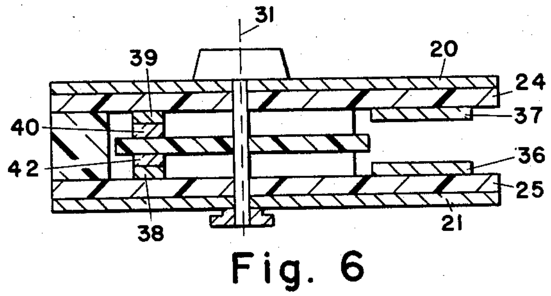
Fig. 6 is a sectional view of the embodiment in Fig. 4 taken along the lines 6—6 in Fig. 5.

Referring now to Figs. 4, 5 and 6, a modification of the tuner illustrated in Figs. 1, 2 and 3 is shown. Here inner conductors 36 and 37 have shunt extensions 38 and 39 formed in a circular arc of fixed radius and disposed between the outer conductors 20 and 21. Movable, elongated, planar conductors 40 and 42 are formed in an arc of the same radius as the extension 38 disposed between the outer conductors adjacent the inner conductor extensions as shown. The conductors 40 and 42 are supported on opposite sides of a rotatable disc 41 as shown. A spacer 43 surrounds the disc 41 to enable the disc 41 to rotate In Figs. 7 and 8 a modification of the tuner in Figs. 4, 5 and 6 is shown in which the ends of the conductors 40 and 42 have curved extensions 44 and 45 which surround the orifice 34 as shown. Here the conductors 20 and 21 and the conductors 40 and 42 are connected together through the shaft 32.

Figure 9:
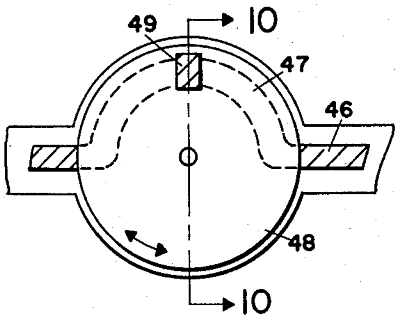
Fig. 9 is a plan view of a portion of still another embodiment of the invention.
Figure 10:
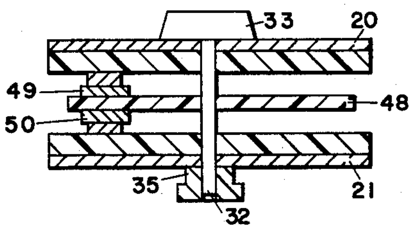
Fig. 10 is a sectional view of the embodiment in Fig. 9 taken along the lines 10—10.

In Figs. 9 and 10 a continuous inner conductor 46 is shown with an arc portion 47. Here a disc 48 carries a pair of conductors 49 and 50 on its opposite surfaces as shown.

Figure 11:
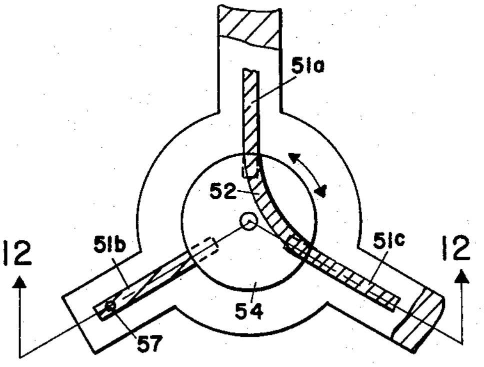
Fig. 11 is a plan view of a portion of a further embodiment of the invention.
Figure 12:
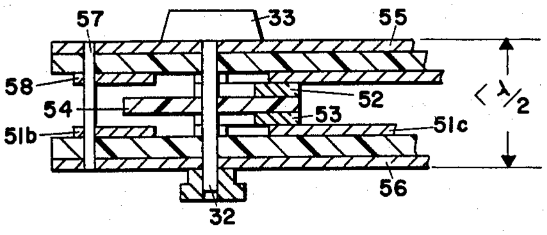
Fig. 12 is a sectional view of the embodiment in Fig. 11 taken along the lines 12—12.

In Figs. 11 and 12 there is illustrated a phase shifter for high frequency transmission lines comprising a first outer planar conductor 55 and a second outer planar conductor 56. A plurality of co-planar, inner, planar conductors 51 are disposed in parallel with and in insulated spaced relation between the outer conductors 55 and 56 to provide transmission lines. The outer conductors 55 and 56 are separated less than a half-wave length apart at the highest operating frequency of the line as shown. A pair of switching conductors 52 and 53 are congruently disposed on the opposite sides of a disc 54. The switching conductors 52 and 53 overlap the conductors 51 as indicated by the dashed lines. The transmission line arm as represented by inner conductor **51*b* in the embodiment shown is terminated in a short circuit by a conductive rod 57 which connects the conductors 55, 58, 51 and 56 together as shown, particularly in Fig. 12. The transmission line arm represented by the inner conductor 51*c*** is terminated in an open circuit as shown.

*Operation of the invention*

The tuner of Figs. 1 through 3 provides a device familiarly termed a "line stretcher" in the art. Such devices are utilized as tuners for antennas and transmission lines by varying the phase of standing waves generated along the line by a discontinuity such as an impedance mismatch. The tuner is utilized for such well-known purposes as impedance matching, filtering, directively coupling and varying the degree of coupling in wave propagating systems. The shifter may also be used for tuning antennas or transmission lines by varying the phase of energy propagated along a path relative to that of the energy along another path. In this context the device may be used, for example, to vary the front-to-back ratio of a directional coupler or to vary the phase of radiated energies of elements of an antenna array to provide a desired radiation pattern.

In the tuner of Figs. 1 through 3, the relative positions of the conductors 29 and 30 along the arcs of the inner conductors 27 and 22 are varied by means of a tuning knob 33 and shaft 32 attached to the supporting insulator 28. It will be apparent that the supporting insulator 28 may be rotated clockwise a sufficient amount to interrupt the passage of energy through the line and provide switching action. While the device as illustrated utilizes two movable conductors 29 and 30 and two inner conductors 27 and 22 only one inner conductor and one movable conductor are essential to its operation. Rotation of the insulator 28 about the axis 31 varies the effective electrical length of the inner conductors 27 and 22 to vary the impedance of the line along its length.

The tuner illustrated in Figs. 4, 5 and 6 is familiarly termed a "shunt tuning stub" in the art. Here the inner conductor extensions 38 and 39 are terminated in an open circuit. The effective position of the open circuit relative to the inner conductor is varied by rotating the disc 41 which carries the movable tuning conductors 40 and 42. The relative positions of the conductors 40 and 42 and the inner conductor extensions 38 and 39, respectively, determine the effective electrical length of the shunt extensions 38 and 39 effectively to vary the impedance of the line along its length. Here both the phase and amplitude of the standing waves are adjusted since the shunt tuning stub provides a changeable impedance (L, R or C) in shunt with the line.

Figure 7:
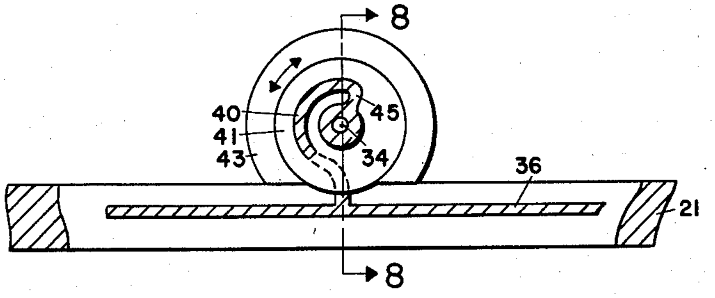
Fig. 7 is a plan view of a part of a modification of the embodiment in Fig. 4.
Figure 8:
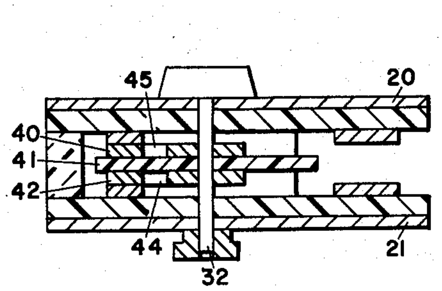
Fig. 8 is a sectional view of the embodiment in Fig. 7 taken along the lines 8—8.

In the modification of Figs. 7 and 8, the shunt tuner is terminated in a short circuit as provided between the connection between the shaft 32 and the conductors 20 and 21, and 44 and 45. As is well known in the art, variation of the position of the short circuit provides inverse effects relative to the open circuit termination described above.

In the embodiment of Figs. 9 and 10, a shunt tuning stub is provided by the conductors 49 and 50. Here the position of the tuning stub is varied relative to the conductor arc 47 to provide a fixed shunt impedance to cancel an impedance mismatch occurring along the line.

In the phase shifter of Figs. 11 and 12 any pair of a plurality of inner conductors may be selected for interconnection by the switching conductors 52 and 53. The conductors 52 and 53 are positioned and the desired pair of inner conductors selected by rotating the disc 54 by means of a tuning knob 33 and shaft 32 which are mechanically coupled to the disc 54. The coupling between the switching conductors 52 and 53 and the inner conductors 51 may be effected by either a direct connection or capacitive coupling as mentioned above. Assuming a source of high frequency energy is directed through the transmission line arm as represented by the inner conductor **51*a* toward the switch, the energy may be shifted in phase by terminating the line in a short; namely, connecting the inner conductor 51*a* to the inner conductor 51*b*. A shift of 90° takes place by connecting conductors 51*a* and 51*c*. By a suitable choice of conductor lengths, a shift of 270° may be realized by connecting the inner conductor 51*b* to the inner conductor 51*c*. Thus, for example, the distance from the end of the conductor 51*a* to the ends of the conductors 51*b* and 51*c* may be chosen to be an odd number of quarter-wave lengths. By connecting the conductors 51*b* and 51*c*, the conductor 51*a* may be terminated in an open circuit to shift the energy in that arm an odd integral number of quarter-wave lengths. In accordance with well-known principles in the art, the degree of phase shift may also be varied by a suitablez choice of termination impedances for the conductors 51*b* and 51*c***.

While applicant does not intend to be limited to any particular circuit constants or dimensions in the embodiments of the invention just described, there follows a set of component dimensions for the more important components which have been found to be particularly suitable for a tuner of the type represented in Figs. 1 through 3:

For operation at a frequency of 4,000 megacycles:

Center conductors 22 and 27—.165 inch wide,
Outer conductors 20 and 21—not less t han .380 inch wide,
Insulators 24 and 25—.067 inch thick,
Length of arc of conductors 29 and 30—not less than .64 inch,
Inner radius of inner arc of conductors 22 and 27—.400 inch,
Inner radius of outer arc of conductors 22 and 27—.700 inch,
All conductors are formed from copper foil—.00135 inch thick,
Insulater 28—.010 inch thick.

The present invention provides an important step forward over the prior art. Rotary control for phase shifting, tuning and switching purposes is now feasible for adaptation to modern printed circuits.

While there have been described what are at present considered to be the preferred embodiments of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A phase shifter for high frequency transmission lines, comprising: a pair of elongated, outer, planar conductors providing ground planes; a pair of spaced, elongated, inner, planar conductors narrower than said outer conductors and disposed equidistantly in parallel, in register and in insulated relation between said outer conductors to provide a transmission line, said outer conductors being separated less than one-half of one wave length apart at the highest operating frequency of said line, a part of each of said inner conductors being formed in concentric circular arcs of fixed radii and having at least one discontinuity in series with and between said arcs, said arcuate parts of each said inner conductors being concentrically disposed and in parallel, in register and in insulated spaced relation between said outer conductors; a movable, elongated, planar conductor formed in said concentric arcs and disposed in coupling proximity parallel to and between said inner conductor arcs and substantially equidistant between said outer conductors, said movable conductor being adapted to short circuit said discontinuity and to rotate in register with said inner conductor arcs to vary the effective electrical length of said inner conductors; means mechanically coupling said outer and movable conductors together; and means for rotating said movable conductor about an axis and along said arcs to vary the phase characteristics of said transmission line and provide said phase shifter.

2. A phase shifter for high frequency transmission lines, comprising: a pair of elongated, outer, planar conductors providing ground planes; a pair of spaced, elongated, inner, planar conductors narrower than said outer conductors and disposed equidistantly in parallel, in register and in insulated relation between said outer conductors to provide a transmission line, said outer conductors being separated less than one-half of one wave length apart at the highest operating frequency of said line, a part of each of said inner conductors being formed in concentric circular arcs of fixed radii and having at least one discontinuity in series with and between said arcs, said arcuate parts of each said inner conductors being concentrically disposed and in parallel, in register and in insulated spaced relation between said outer conductors; a pair of parallel, registered, spaced, movable, elongated planar conductors formed in said concentric arcs and disposed in coupling proximity parallel to and between said inner conductor arcs and substantially equidistant between said outer conductors, said movable conductors being adapted to short circuit said discontinuity and to rotate in register with said inner conductor arcs to vary the effective electrical length of said inner conductors; means mechanically coupling said outer and movable conductors together; and means for rotating said movable conductor about an axis and along said arc to vary the phase characteristics of said transmission line and provide said phase shifter.

3. A phase shifter for high frequency transmission lines, comprising: a pair of elongated, outer, planar conductors providing ground planes; a pair of spaced, elongated, inner, planar conductors narrower than said outer conductors and disposed equidistantly in parallel, in register and in insulated relation between said outer conductors to provide a transmission line, said outer conductors being separated less than one-half of one wave length apart at the highest operating frequency of said line, a part of each of said inner conductors being formed in concentric circular arcs of fixed radii and having at least one discontinuity in series with and between said arcs, said arcuate parts of each said inner conductors being concentrically disposed and in parallel, in register and in insulated spaced relation between said outer conductors; a movable, elongated, planar conductor formed in said concentric arcs and disposed in coupling proximity parallel to and between said inner conductor arcs and substantially equidistant between said outer conductors, said movable conductor being adapted to short circuit said discontinuity and to rotate in register with said inner conductor arcs to vary the effective electrical length of said inner conductors; insulation means coating said movable conductor to provide capacity coupling with said inner conductors and reduce noise generations; means mechanically coupling said outer and movable conductors together; and means for rotating said movable conductor about an axis and along said arc to vary the phase characteristics of said transmission line and provide said phase shifter.

References Cited in the file of this patent

UNITED STATES PATENTS

| | | |
|---|---|---|
| 2,126,541 | Forest | Aug. 9, 1938 |
| 2,427,110 | Selby | Sept. 9, 1947 |
| 2,475,198 | Reinschmidt | July 5, 1949 |
| 2,502,359 | Wheeler | Mar. 28, 1950 |
| 2,513,393 | Frey | July 4, 1950 |
| 2,644,140 | Pease | June 30, 1953 |
| 2,695,385 | Shunemann | Nov. 23, 1954 |
| 2,705,776 | Starr et al. | Apr. 5, 1955 |
| 2,765,447 | Hesse | Oct. 2, 1956 |
| 2,810,892 | Blitz | Oct. 22, 1957 |

OTHER REFERENCES

Wild, IRE Transactions on Microwave Theory and Techniques, volume MTT–3, March 1955, number 2. Pages 23, 24 and 29 relied upon.